United States Patent [19]

Ichihashi et al.

[11] Patent Number: 4,600,839
[45] Date of Patent: Jul. 15, 1986

[54] SMALL-DIMENSION MEASUREMENT SYSTEM BY SCANNING ELECTRON BEAM

[75] Inventors: Mikio Ichihashi, Kodaira; Satoru Fukuhara, Kokubunji; Masahide Okumura, Sagamihara; Hisaya Murakoshi, Hachioji, all of Japan

[73] Assignee: Hitachi, Ltd., Tokyo, Japan

[21] Appl. No.: 576,324

[22] Filed: Feb. 2, 1984

[30] Foreign Application Priority Data

Mar. 9, 1983 [JP] Japan .................. 58-37389

[51] Int. Cl.$^4$ ............................................ G01N 23/00
[52] U.S. Cl. .................... 250/310; 250/397
[58] Field of Search ............ 250/310, 311, 397, 492.2, 250/491.1

[56] References Cited

U.S. PATENT DOCUMENTS

| | | |
|---|---|---|
| 3,329,813 | 7/1967 | Hashimoto ............ 250/310 |
| 3,597,607 | 8/1971 | Campbell et al. ........... 250/310 |
| 3,864,572 | 2/1975 | van der Mast ............ 250/310 |
| 4,179,604 | 12/1979 | Christon ............ 250/310 |

Primary Examiner—Bruce C. Anderson
Attorney, Agent, or Firm—Antonelli, Terry & Wands

[57] ABSTRACT

A small-dimension measurement system by scanning electron beam comprises an electron optical column including an electron source for emitting an electron beam to scan a sample, at least one pair of detectors disposed symmetrically with respect to an optical axis of the electron optical column for detecting position information from the sample by scanning of the electron beam, and a signal selecting circuit for subjecting the outputs of the paired detectors to a predetermined signal selection. The signal selecting circuit selectively and alternately provides maximum or peak portions of the outputs of the paired detectors which portions correspond to opposite edge portions of the sample. The output of the signal selecting circuit is applied to a signal processing circuit for conversion into a dimension of a predetermined pattern on the sample.

4 Claims, 12 Drawing Figures

SMALL-DIMENSION MEASUREMENT SYSTEM BY SCANNING ELECTRON BEAM

BACKGROUND OF THE INVENTION

The present invention relates to a small-dimension measurement system by scanning electron beam for measuring a small dimension of a sample such as a semiconductor device or the like by an electron beam.

Recently, there is a remarkable tendency of micronization of the processing dimensions of semiconductor devices and the measurement of the dimensions by light such as a laser beam or the like has already reached its limit. The development of measuring techniques using a high resolving power of an electron beam is needed for measurement of the pattern dimensions in the submicron region in association with realization of VLSIs. In many cases, a scanning electron microscopy is generally used for such measurement. However, the scanning electron microscopy is inherently an observing apparatus and differs from an small-dimension measurement system by scanning electron beam with respect to signal detecting and processing methods in that the latter system provides the signal with a high accurate position information which is required for measurement of small dimensions.

FIGS. 1A and 1B illustrate an example of a detected signal by one detector having a construction which is generally used in a conventional scanning electron microscopy (see T. E. EVERHART & R. F. M. THORNLEY, J. Sci. Instr., 37,246 (1960)). FIG. 1 is a diagrammatical cross section of a sample to be measured. A pattern 2 (in this example, design dimension L=1.2 μm and a thickness is 0.8 μm) is formed on a wafer substrate 1. FIG. 1B shows a signal waveform including position information to be obtained by deflecting a scanning electron beam over the pattern 2. It can be seen from FIG. 1B that there are differences between the peak values of and the signal widths Δu and Δw of the leading and trailing portions of the detected signal corresponding to edge portions 2u and 2w of the pattern 2. Although such signal waveforms at the edge portions may be influenced by the spot diameter of the scanning beam, fine configurations of the pattern edge portions, etc. the fact that the characteristics of the signal waveforms do not change even if the sample is rotated by 180°, shows that the above-mentioned signal waveforms are originated from the signal detection manner. This is because, in general, the scanning electron microscopy has only one detector and hence the pattern 2 itself to be measured causes a shadowing effect at the edge portion 2w. A shadow produced by this effect is effective to obtain far/near sense and unevenness sense of a scanned image of a sample in the scanning electron microscopy. However, the shadow provides a cause of measurement error from the viewpoint of dimension measurement by electron beam. In FIG. 1B, the length l of the shadow is approximately equal to the pattern dimension L and the leading and trailing widths of the signals detected at the edge portions 2u and 2w have a difference therebetween in order of 2-3 times. From such asymmetric detection signals, it is impossible to obtain the high-accurate measurement in the sub-micron region which is required in the small-dimension measurement by scanning electron beam.

There has been reported a system in which a plurality of detectors are used to improve the S/N ratio of signals (see Japanese Patent Application Laid-open No. 35854/83). But, the system does not take the above-mentioned shadowing effect into consideration and hence there is a drawback that the detection signals themselves include position information errors.

SUMMARY OF THE INVENTION

An object of the present invention is to provide a small-dimension measurement system by scanning electron beam which can accurately detect position information signal from a sample to be measured, thereby enabling the microdimensions to be measured with high degree of accuracy.

To accomplish the above object, according to the present invention, a small-dimension measurement system comprises an electron source, focusing and deflecting means for focusing an electron beam emitted from the electron source and for scanning a sample to be measured, signal detection means including at least one set of detectors disposed symmetrically with respect to an electro-optical axis for detecting position information signals obtained from the sample through the scanning of the sample by the electron beam, signal selection means for selecting only a detection signal from the detector facing an edge portion of the sample to be measured by separating a signal from the detector in the rear of the edge portion, and signal processing means for processing the detection signal for conversion into a dimension on the sample.

DESCRIPTION OF THE PREFERRED EMBODIMENTS

The present invention will be described hereinbelow in detail with reference to embodiments.

Figure 2:
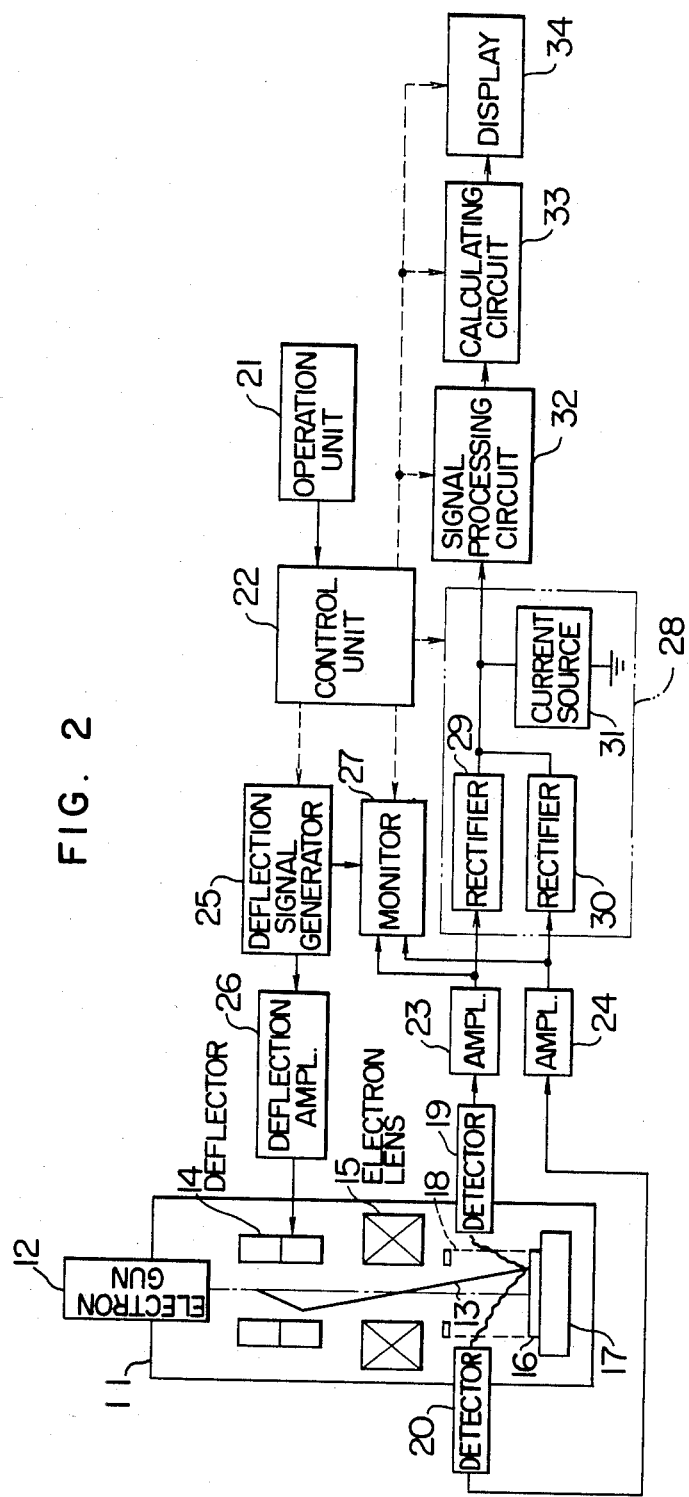
FIG. 2 is a constitutional block diagram of a small-dimension measurement system by scanning electron beam according to an embodiment of the present invention.

FIG. 2 is a block diagram showing a small-dimension measurement system by scanning electron beam according to an embodiment of the present invention. In an electron optical column 11, an electron beam 13 emitted from an electron gun 12 is deflected by a deflector 14 and is focused into a fine spot beam by an electron lens 15 so that the focused electron beam scanned two- or one-dimensionally on a sample 16 to be measured. The sample 16 is mounted on an X-Y table 17 and is moved to a next measuring position by a well known table driving means (not shown) in accordance with a control signal from a control unit 22. Information signals such as secondary electrons, reflected electrons, etc. generated due to an interaction between the electron beam 13 and the sample 16 are detected by at least two detectors 19 and 20 to eliminate the measurement error which has been explained in conjunction with the conventional system. Supplemental grid electrodes 18 form a symmetrical collecting field of signals around the electro-optical axis. The supplemental grid electrodes 18 are provided for eliminating non-uniformity of a signal collecting electric field formed by the detectors 19 and 20. Signals from the sample 16 are detected by the detectors 19 and 20 such as photomultipliers or SSDs which are disposed symmetrically with respect to the electro-optical axis. Although two detectors are shown for the purposes of simplicity, more than two detectors may be used as will be described later with respect to FIGS. 3A and 3B. The detected signals are amplified to predetermined levels by signal amplifiers 23 and 24 (which may be replaced by summing amplifiers in the cases of FIGS. 3A and 3B which will be described later). The deflection of the electron beam 13 is controlled by a scan signal from the control unit 22 through a deflection signal generator 25 and a deflection amplifier 26. At the same time, a scan signal synchronized with the deflection of the electron beam 13 is supplied from the deflection signal generator 25 to a monitor 27. If the output signals from the signal amplifiers 23 and 24 are used for brightness modulation of the monitor 27, a so-called two-dimensional scanning image will be obtained. On the other hand, if they are used for Y modulation, a position information waveform will be obtained. The monitor 27 performs the checking of the position of the pattern to be measured, the setting of conditions for small-dimension measurement, etc.

The outputs of the signal amplifiers 23 and 24 are also supplied to a signal processing circuit 32 through a signal selection circuit 28 in order to accomplish the aimed object of the present invention. The detection signals are converted into position information by the signal processing circuit 32 which has processing modes such as threshold level detection, peak detection, etc. On the basis of the position information, an actual dimension is determined by a calculating circuit 33 and is displayed on a display device 34. As is apparent, the control unit 22 is a controller which supplies sync signals for the setting of timings, control signals, for signal processing and the like to the above-mentioned deflection signal system, detection signal processing system, etc. An operation unit 21 generates a control signal for controlling the control unit 22.

Figure 1A:
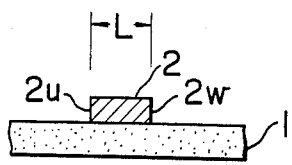
FIGS. 1A and 1B are views for explaining the detection of a micro pattern by a conventional scanning electron microscopy, FIG. 1A showing a cross section of a sample to be measured and FIG. 1B showing a detection signal.
Figure 1B:
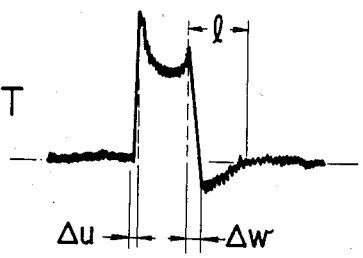
Figure 3A:
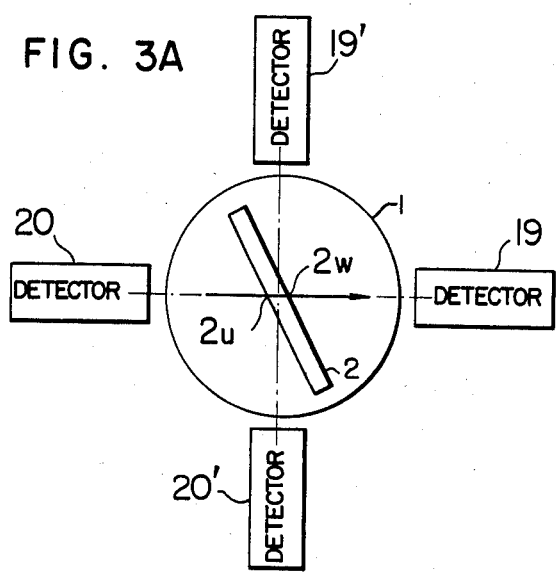
FIGS. 3A and 3B are plan views illustrating examples of a detector arrangement used in the present invention.
Figure 3B:
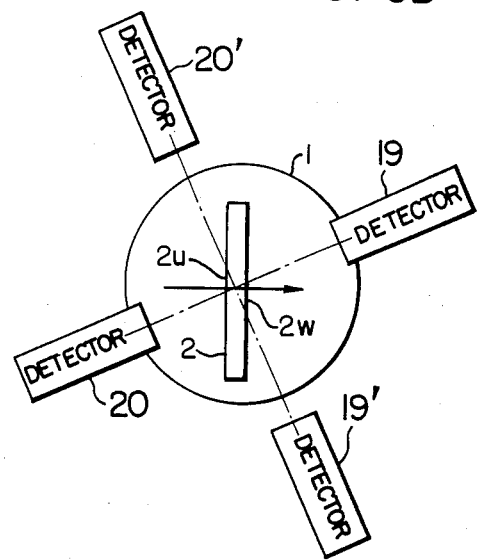

Explanation will now be made of the main part of the present invention to eliminate the position detection error by the system having the above-described constitution. FIGS. 3A and 3B are plan views showing examples of detector arrangement. Generally, in small-dimension measurement systems, it is desired to measure the dimensions in two orthogonal (X,Y) directions. Therefore, two sets of detectors (19, 20) and (19', 20') are used in such a manner that the paired detectors in each set are disposed symmetrically with respect to the electron optical axis as shown in FIG. 3A. The DC levels and gains of the detectors in each pair involving the associated signal amplifiers are preliminarily adjusted. In FIGS. 3A and 3B, an arrow represents a direction in which the electron beam is scanned over the pattern 2.

Figure 4A:
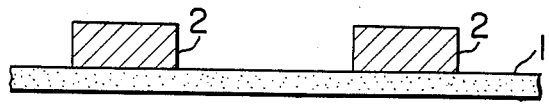
FIGS. 4A to 4F are views for explaining the small-dimension measurement performed by the embodiment shown in FIG. 2, FIG. 4A showing a cross section of a sample to be measured, FIG. 4B illustrating the waveform of the sum of detection signals from the detector arrangement shown in FIG. 3A, FIGS. 4C and 4D illustrating the respective waveforms detected by two sets of detectors shown in FIG. 3A, FIG. 4E illustrating the output waveform of a signal selecting circuit shown in FIG. 2, and FIG. 4F illustrating the output of a signal processing circuit shown in FIG. 2.
Figure 4B:
Figure 4C:
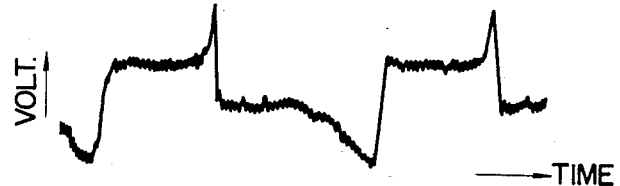
Figure 4D:
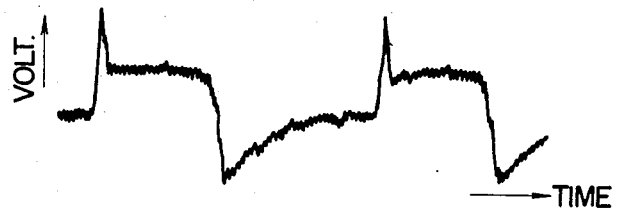
Figure 4E:
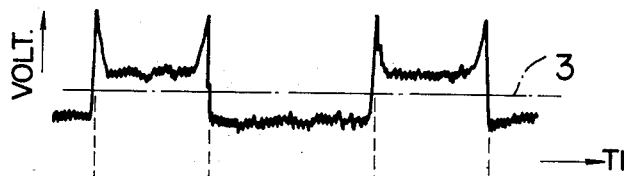

FIGS. 4A to 4F are views for explaining the small-dimension measurement performed by the shown embodiment. FIG. 4A illustrates a diagrammatical cross-sectional view of a sample to be measured, in which patterns 2 on a sample substrate 1 are scanned by an electron beam. FIG. 4B shows a total signal waveform obtained from the two sets of detectors by the electron beam scanning. From FIG. 4B, it will be understood that the symmetry of waveform is improved but the signal level corresponding to a portion of the sample substrate 1 having no pattern thereon is not flat due to influence of a shadowing effect of the pattern 2 itself. To eliminate this inconvenience, a sum signal of the detectors 19 and 19' on the same side for the pattern edge portion 2w shown in FIG. 3A and a sum signal of the detectors 20 and 20' on the same side for the edge portion 2u are separately detected through summing amplifiers (the output of which are shown in FIGS. 4C and 4D respectively) and the detected signals are subjected to signal selection by the signal selecting circuit 28 of FIG. 2. When only one set of detectors are used, the outputs of the respective detectors are separately detected by usual amplifiers. The signal selecting circuit 28, for example, serves as a maximum detection circuit which sequentially compares the signal waveforms shown in FIGS. 4C and 4D to detect maximum values involved therein. In the illustrated embodiment, the circuit 28 is constituted by rectifiers 29 and 30 and a current source 31. The current source 31 includes a resistor element and a bias power supply. The output waveform of the signal selecting circuit 28 thus obtained is shown in FIG. 4E. From comparison of the total signal waveform shown in FIG. 4B and the signal waveform shown in FIG. 4E, it will be understood that the latter waveform has no blunting of the edge peak and has signal levels which are constant at the substrate portion and the pattern portion respectively. The use of the signal waveform shown in FIG. 4E allows accurate conversion into position information by the threshold level detection processing or peak value detection processing of the signal processing circuit 32.

Figure 4F:

The conversion into dimension by the signal processing circuit 32 will now be described with respect to an example of the threshold level detection processing. In the signal processing circuit 32, a threshold level 3 shown in FIG. 4E is supplied and a shaped pulse waveform as shown in FIG. 4F is obtained on the basis of the DC level 3 and the output of the signal selecting circuit 28. The pulse width of the shaped pulse waveform provides a dimension L of the pattern to be measured. It is not always necessary to obtain such a shaped waveform. It may be possible to estimate the dimension L from the deflection addresses of the primary electron beam 13 corresponding to the coordinates of the cross points of the DC level 3 and the signal waveform of FIG. 4E.

As described above, the signal waveform obtained according to the present invention is not affected by the shadow of the pattern but faithfully reflects the pattern shapes at the edge portions 2u and 2w, thereby providing accurate dimension. This effect can be similarly obtained in a case of the peak value detection processing, too.

The present invention is not limited to only the above-described embodiment. For example, although one set or two sets of detectors disposed symmetrically with respect to the electron optical axis have been described, any plural sets of detectors may be used depending upon the applications of the system. The distance of the detector from the electron optical axis may differ between the detector sets as shown in FIG. 3B, so long as detection error can be eliminated using the signal selecting circuit 28.

If each detector is arranged to be at an equal distance from the electron optical axis as shown in FIG. 3A, the supplemental grid electrodes 18 can be removed. In addition, the electrodes 18 are not always necessary to be arranged symmetrically about the electron optical axis.

Figure 5:
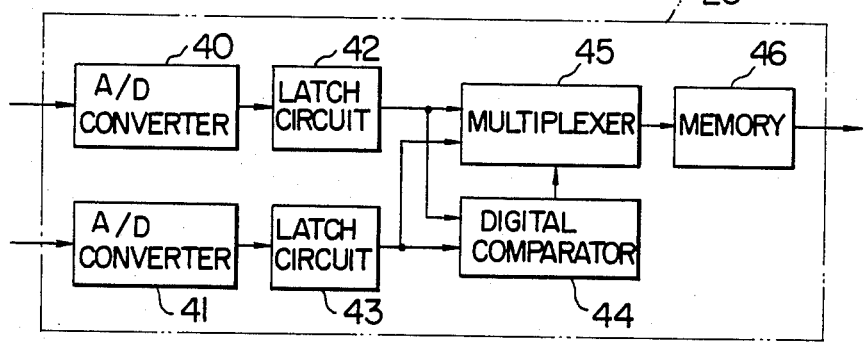
FIG. 5 is a circuit diagram showing another example of a signal selecting circuit used in the present invention.

The signal selecting circuit can be also constructed by a digitized configuration 28' as shown in FIG. 5. Detected signals from the signal amplifiers 23 and 24 are respectively converted into digital signals by analog to digital converters 40 and 41 and the timings of these digital signals are matched by latch circuits 42 and 43. The outputs of the latch circuits 42 and 43 are applied to a digital comparator 44 as well as a multiplexer 45. The signals are compared by the digital comparator 44 and the multiplexer 45 is switched in accordance with the output of the comparator 44, thereby enabling the maximum detection for the detection signals. The output of the multiplexer 45 may be stored in a memory 46 for position information processing in a form of digital values. In addition, it may be possible to add the outputs of the analog to digital converters 40 and 41 a number of times for improvement of S/N ratio and to then write it in the memory for performing the maximum detection processing. If the output of the multiplexer 45 is subjected to digital to analog conversion, the signal processing circuit 32 of FIG. 2 can be used as it is.

As described above, according to the present invention, since an information signal including no dimension error is obtained, it is possible to realize small-dimension measurement with high accuracy and good reproductivity in a sub-micron region which is required for the small-dimension measurement system by scanning electron beam. Also, since this can be realized by merely adding the signal selecting circuit having a simple constitution, conversion error of the signal processing circuit to convert into position information can be remarkably reduced.

We claim:

1. A small-dimension measurement system by scanning electron beam, comprising:
   an electron source;
   focusing and deflecting means for focusing an electron beam emitted from said electron source and for scanning a sample having opposite edge portions and a dimension therebetween which is to be measured;
   signal detection means including at least one pair of detectors disposed symmetrically with respect to an electron-optical axis so that one detector in said detector pair faces one of said opposite edge portions of said sample while the other detector in said detector pair faces the other of said opposite edge portions, each of said one and other detectors detecting a position information signal from said sample through the scanning of the electron beam;
   signal selection means for selected only that portion of the position information signal detected by said one detector which corresponds to position information of said one edge portion and only that portion of the position information signal detected by said other detector which corresponds to position information of said other edge portion so that an influence of shadow effects by said edge portions of said sample which influence of shadow effects is contained in the position information signal detected by said pair of detectors is eliminated, said signal selection means comparing the position information signals separately detected by said one and other detectors and performing maximum detection; and
   signal processing means for processing the signal portions selected by said signal selection means for conversion into the dimension between said opposite edge portions on said sample.

2. A measurement system according to claim 1, further comprising a grid electrode disposed between said sample and said detectors for eliminating non-uniformity of a signal collecting electric field to be formed by said detectors.

3. A measurement system according to claim 1, wherein said signal detection means includes plural pairs of said detectors, and said signal selection means receives a first sum signal of the respective position information signals detected by respective detectors in the plural detector pairs facing said one edge portion and a second sum signal of the respective position information signals detected by respective detectors in the plural detector pairs facing said other edge portion to select only the portions of said first and second sum signals which correspond to position information of said one edge portion and position information of said other edge portion, respectively.

4. A measurement system according to claim 3, wherein said signal selection means compares said first and second sum signals to perform maximum detection.

* * * * *